United States Patent
Damy et al.

(10) Patent No.: US 9,647,637 B2
(45) Date of Patent: May 9, 2017

(54) SAW FILTER WITH IMPROVED STOP BAND SUPPRESSION

(75) Inventors: Jacques Antoine Damy, Nice (FR); Christian Waterkeyn, Valbonne (FR); Holger Emrich, Munich (DE)

(73) Assignee: SNAPTRACK, INC., San Diego, CA (US)

( * ) Notice: Subject to any disclaimer, the term of this patent is extended or adjusted under 35 U.S.C. 154(b) by 201 days.

(21) Appl. No.: 14/405,392

(22) PCT Filed: Jun. 5, 2012

(86) PCT No.: PCT/EP2012/060611
§ 371 (c)(1),
(2), (4) Date: Mar. 30, 2015

(87) PCT Pub. No.: WO2013/182229
PCT Pub. Date: Dec. 12, 2013

(65) Prior Publication Data
US 2015/0244348 A1    Aug. 27, 2015

(51) Int. Cl.
*H03H 9/64* (2006.01)
*H03H 9/145* (2006.01)
*H03H 9/02* (2006.01)

(52) U.S. Cl.
CPC ........ *H03H 9/6406* (2013.01); *H03H 9/0222* (2013.01); *H03H 9/02543* (2013.01);
(Continued)

(58) Field of Classification Search
CPC ............. H03H 9/0222; H03H 9/02543; H03H 9/02637; H03H 9/02716; H03H 9/02779;
(Continued)

(56) References Cited

U.S. PATENT DOCUMENTS 5,932,950 A * 8/1999 Yamada ............... H03H 9/0028
    310/313 B
6,023,122 A   2/2000 Liu et al.
(Continued)

FOREIGN PATENT DOCUMENTS

EP    1143613 A1    10/2001
EP    2043260 A2     4/2009
(Continued)

OTHER PUBLICATIONS

Hakiki, M. El et al.: "Very Large Bandwidth IF SAW Filters Using Leaky Waves on LiNbO3 and LiTaO3", Ultrasonics Symposium (IUS), 2011 IEEE International, IEEE, Oct. 18, 2011, pp. 1325-1328.
(Continued)

*Primary Examiner* — Barbara Summons

(57) ABSTRACT

A filter working with surface acoustic waves comprises a piezoelectric substrate (SU), a first transducer (IDT1) arranged in the acoustic track coupled to an input, having a first mean finger period (pi) assigned to a center frequency of a pass band of the filter and a second transducer (IDT2) arranged in the acoustic track coupled to an output, having the same first mean finger period (p1), and a reflector arranged between first and second transducer having a second mean finger period (p2) assigned to a stop band frequency different from the center frequency. Further, a new type of very broad bandwidth filters with small insertion loss and high return loss and high rejection are given that use a substrate that can propagate a PSAW and comprises fan shaped transducers.

18 Claims, 8 Drawing Sheets

(52) U.S. Cl.
CPC .... *H03H 9/02637* (2013.01); *H03H 9/02716* (2013.01); *H03H 9/02779* (2013.01); *H03H 9/14547* (2013.01); *H03H 9/14558* (2013.01); *H03H 9/14561* (2013.01); *H03H 9/14567* (2013.01); *H03H 9/643* (2013.01); *H03H 9/6493* (2013.01)

(58) Field of Classification Search
CPC ........... H03H 9/14558; H03H 9/14561; H03H 9/14547; H03H 9/14567; H03H 9/6406; H03H 9/643; H03H 9/6493
USPC .................................................. 333/193, 195
See application file for complete search history.

(56) References Cited

U.S. PATENT DOCUMENTS

| | | | |
|---|---|---|---|
| 6,720,842 B2 | 4/2004 | Sawada | |
| 6,833,774 B2* | 12/2004 | Abbott | ................. H03H 9/6483 310/313 A |
| 7,304,553 B2 | 12/2007 | Bauer et al. | |
| 7,800,281 B1 | 9/2010 | Grama et al. | |
| 2007/0279157 A1 | 12/2007 | Bauer | |
| 2010/0102901 A1* | 4/2010 | Tsuda | ................. H03H 9/02716 333/195 |
| 2012/0105174 A1* | 5/2012 | Lee | ...................... H03H 9/6453 333/193 |
| 2013/0257220 A1* | 10/2013 | Martin | .................. H01L 41/047 310/313 B |
| 2013/0321103 A1 | 12/2013 | Elhakiki et al. | |

FOREIGN PATENT DOCUMENTS

| | | |
|---|---|---|
| EP | 2180597 A1 | 4/2010 |
| JP | S61-10309 A | 1/1986 |
| JP | H07122965 A | 5/1995 |
| JP | H08-335848 A | 12/1996 |
| JP | 2005102119 A | 4/2005 |
| JP | 2005203996 A | 7/2005 |
| JP | 2010103849 A | 5/2010 |
| JP | 2010171805 A | 8/2010 |
| WO | WO-0137426 A1 | 5/2001 |

OTHER PUBLICATIONS

B3773 Datasheet—"SAW Components", http://www.epcos.com/inf/40/ds/ae/B3773.pdf, Apr. 4, 2007, pp. 1-10, Munich, Germany.

* cited by examiner

SAW FILTER WITH IMPROVED STOP BAND SUPPRESSION

The application refers to a SAW filter with improved stop band attenuation and more preferably to broadband SAW filters (SAW=surface acoustic wave) that are useful for mobile communication in mobile phones, wireless terminals or base stations.

For improving stop band attenuation measure have to taken that usually have an impact on the transfer function of the filter especially in the pass band. Hence, normally a trade-off has to be made between stop band attenuation and insertion loss.

Further, there have been made some attempts to provide filters having a very large relative bandwidth of say about 8% or more. Ceramic filters for example are used for very large bandwidth filters with low losses but they are very expensive. Further, the steepness of the skirts of the transmission bands is poor in view of SAW filters.

Commonly used SAW filters are working with Rayleigh waves. But this type of SAW waves does show only small coupling and hence, results in wide band filters that produce big losses when increasing the bandwidth of these filters up to more than 20%. This is true for all SAW filters using Rayleigh waves. A greater bandwidth yields a greater loss for a given coupling. A higher coupling yields a lower loss for a given bandwidth.

It is thus a first object of the invention to provide a filter having an improved stop band attenuation without deteriorating the pass band of the filter. It is a second object of the invention to provide a large bandwidth filter that is less expensive than a ceramic filter and that shows only small losses e.g. a small insertion loss in the pass band thereof.

The first object is met by a filter according to claim 1. Embodiments and improvements of the filter are given by further dependent claims.

A filter is provided on a piezoelectric substrate comprising a first and a second transducer for input and output of the filter. Within the acoustic track between first and second transducer a reflector is arranged. Electrode fingers of first and second transducer have a first finger period assigned to a centre frequency of the pass band. The reflector has reflector fingers with a second finger period that is assigned to a second frequency within a stop band of the filter.

As the reflector reflects SAW waves that propagate from an input transducer and have a second frequency within a stop band these waves are thereby prohibited from reaching the output transducer. Hence this frequency is suppressed and the stop band attenuation is improved without producing any loss within the pass band.

It is preferred to connect all reflector fingers of the reflector to a fixed potential or ground.

Further, it has been found that transducers working with SAW waves of the type PSAW (PSAW=pseudo SAW) are promising candidates for use within a broadband filter. The reason is that PSAWs have a much better coupling to the substrate than ordinary SAWs like Rayleigh waves or shear waves.

PSAWs can be generated on crystalline piezoelectric substrates having a proper chosen cut angle making a commonly used transducer preferably generating PSAWs.

The high coupling of PSAWs is further responsible for a high reflection which can easily reach 10% for 2 reflector fingers per wavelength λ. Hence, the reflector according to the invention can be made relatively short with 10-20 reflector fingers. For example, with a number of 16 reflector fingers at a relative metallisation height of about 1% the reflector shows a reflection of about 80%. That makes about 8 dB decrease of transmission in the area around the stop band. A short reflector has fewer influence on the pass band than a longer one. Further it needs only small space on the substrate.

In an embodiment a SAW filter working with acoustic waves of the PSAW type is provided comprising a piezoelectric substrate that is chosen to propagate a PSAW. First and second transducer comprise a multitude of cells with a respective electrode finger combination. The cells are arranged after one another in a longitudinal direction being the propagation direction of the PSAW, at least part of the cells are Single Phase Uni-Directional Transducer (SPUDT) cells. Hence the PSAW generated at the input transducer has a preferred direction of propagation that is towards the output transducer. The large relative bandwidth of the transducer is realized by using fan-type or fan shaped transducers. Such a transducer comprises a given pattern of electrode fingers, wherein the distances between the centres of each pair of transducer fingers increase in a transversal direction thereby also increasing the pitch of the transducer and reducing the frequency corresponding to the pitch.

In a FAN transducer the width of a transducer finger and each spacing between the fingers of a respective pair of adjacent transducer fingers are commonly increasing to the same extent. Hence, it is preferred that the finger pattern in a longitudinal direction is increased in a transversal direction.

But it is possible too to keep one of these parameters (spacing or width) constant while increasing the other disproportionally. This increase can thus be made by scaling the distance only or the width only. Increasing both parameters asymmetrically is possible too. Advantageously dimensional scaling of the finger pattern is selected to reach a large relative bandwidth of the transducer of at least 8% and up to 50% and more.

The finger period of the reflector is assigned to a specified stop band frequency and is hence constant over the whole aperture of the filter despite the varying finger period of the fan transducers.

According to a further embodiment the first and the second transducer have different metallisation ratios η1 and η2 respectively. The metallisation ratio of a transducer or otherwise metallised surface has practically no influence on the velocity of the PSAW but has a greater influence on the velocity of the Rayleigh wave. The different metallisation ratios of the two transducers allow shifting the response of the Rayleigh wave in the output transducer for more than 2% relative to the response of the PSAW. This way Rayleigh waves can be attenuated by about 6 dB.

According to an example the first metallisation η1 ratio is chosen between 0.15 and 0.40 while the second metallisation η1 ratio is chosen between 0.60 and 0.80. But the two etas may be chosen arbitrarily and can assume value beyond the preferred ranges but need to be different at all.

In a more specified embodiment the first metallisation η1 ratio is 0.3 while the second metallisation η2 ratio is 0.7.

According to the high coupling of the PSAW in properly chosen substrates the metallisation height can be chosen relatively low. A relative metallisation height h/λ from 0.5 to 4% is sufficient and a good trade-off between coupling, series resistance and reflection. A preferred height is about 1%. But higher heights are possible too.

Preferred piezoelectric substrates that support the generation of PSAWs are chosen from piezoelectric materials that have a high coupling. Two specific cuts of different piezoelectric materials are found to be advantageous for this purpose. Lithium niobate with a rotated Y-cut of 41° (LN41rotY). Another preferred substrate is based on lithium tantalate (LT) with a rotated XY cut of 36° (LT36rotXY). Substrates based on lithium tantalate are preferred if smaller bandwidths <20% are desired. Further, filters build up on LT cuts usually have better temperature behaviour i.e. a smaller dependence of their properties on temperature changes.

Beside these cuts optimized for high coupling of PSAWs and low propagation loss other materials with cut angles are possible that vary around the above given value. Variations of up to ±30° for LN and of up to ±5° for LT provide reasonable trade-offs for resulting in a substrate material having higher PSAW coupling but at the same time a lower propagation loss.

When compared to LT, LN shows a large cut angle range which is optimal for high coupling of PSAWs and low propagation loss at low metallization height.

Filters with fan-shaped transducers preferably comprise SPUDT cells. Preferred SPUDT cells for creating the inventive broad bandwidth filter are chosen from the type Hanma Hunsinger and Floating Electrode Uni-Directional Transducer (FEUDT). These SPUDT cell types are preferred because they show a relative low reflectivity compared to cells having two electrode fingers per wavelength that could have too much reflection for compensation of triple transit signals. The preferred SPUDT cell types have a structure of at least four electrode fingers per wavelength and a reflection of about 1-2% per electrode finger. The cells are optimized to generate PSAW and to minimize the effect of still generating and propagating Rayleigh waves. Cells having 2 fingers per wavelength show a higher reflectivity that amounts 10% per finger at a relative metallization height of about 1%.

According to an embodiment of the invention the transducer has a relative metallization height (relative to the wavelength) that is chosen
  to minimize the propagation loss and
  to yield a reflection coefficient for the four-finger-cell of
    for example between 1 and 3%. and
  to suppress Rayleigh waves that are unwanted in this case.

In an embodiment using LN41rotY as substrate material of the filter an optimum in view of propagation loss and reflection coefficient corresponds to a relative metallization height that is between 1 and 3%.

A transducer transduces an electric RF signal into an acoustic wave and vice versa. The relative bandwidth of such a transducer is dependent on the range of wavelengths that are transduced with high efficiency, i.e. with low attenuation. By using a piezoelectric substrate having a cut showing a large coupling for PSAWs, using a cell type and a relative metallization height having low reflection, providing a high metallization ratio to limit the propagation loss, it is possible to produce transducers having a relative bandwidth of up to 50% and more. Hence filters can be manufactured there from that have a pass band width of about 50% relative to the centre frequency.

First and second transducers are arranged along a longitudinal direction within the same acoustic track.

In an embodiment the reflector comprises two fingers per wavelength λ on the base of the desired stop band frequency. It has been found out that two fingers per wavelength λ produce a stronger reflection compared with reflectors having 4 fingers per wavelength. At frequencies that do not correspond to the pitch of the reflective grating the respective number of fingers per wavelength varies as the basic wavelength varies. Finger numbers other than natural numbers can arise. For numbers of fingers per wavelength departing from 2 the reflection is low and can reach zero at 4 fingers per wavelength. Hence, as the pass band frequency does not comply with the stop band frequency, the according finger number departs from 2 and reflection is low. Both transducers of the filter comprise SPUDT cells wherein the unidirectionality of the second transducer is opposite to the unidirectionality of the first transducer.

In one embodiment, the second transducer has the same bandwidth like the first transducer. In a preferred embodiment the second transducer has a structure that complies with a horizontally flipped first transducer.

Because of the unidirectionality of the two transducers only a very low degree of waves can leave the acoustic track in a longitudinal direction. These unwanted waves that can produce detrimental signals can be absorbed by arranging a damping mass at both ends of the acoustic track. The damping mass can extend in a transversal direction over the whole aperture of the acoustic track, that is parallel to the whole length of the electrode finger overlap. The damping structure comprises a damping mass that is preferably a resin having matched acoustic properties that the PSAW may easily enter into the damping mass where it is absorbed by non-elastic deflection or oscillation.

A shielding structure is arranged between first and second transducer and comprises a fully metalized area or a non-reflective finger grating that is adapted to minimize the free propagation area between the transducers and the shielding structure thereby minimizing the propagation loss of the PAW that would result from a free surface area.

The shielding structure covers a trapezoid area, the width of which is increasing in a traversal direction opposite to the width increase of the transducer electrode fingers.

The shielding structure is useful for compensating different delay times that occur because of the varying finger width and finger spacings. The most preferable structure of the shielding structure totally compensates lower delay time in each of the two transducers by providing a respectively higher delay time inside the shielding structure. The delay time within an acoustic path comprising a metalized area that may be completely metalized or have a finger grating is dependent on the metallization ratio that rules the propagation velocity of the acoustic wave. The higher the metallization ratio, the lower is the acoustic velocity. As far as the shielding structure is realized by a finger grating the fingers of the shielding structure are electrically shorted for avoiding excitement of acoustic waves or out-coupling of these waves.

A fan-type transducer has a large bandwidth because it comprises a multitude of parallel channels, each channel having a respective middle frequency that is different for all channels. Within a channel all finger width and/or finger spacings may be constant. In such an embodiment the fan structure has a stepped structure. In a stepped structure having n different channels n may be selected as an integer with 5<n<50.

But it is possible too that the fan-type transducer has a continuous structure whose fragmentation into different channels is only virtual. Such a virtual channel may be defined by a given bandwidth of the channel. A desired bandwidth of a channel is selected by selecting a transversal section that is defined by the according amount of finger width variation within this section.

In an embodiment at least one of the transducers that is the input transducer and/or the output transducer is connected to ground via a shunt arm. In the shunt arm a capacitor is arranged.

The capacitance of that capacitor adds up to the quality factor Q of the filter by decreasing the effective coupling between input and output of the filter. A capacitance near the filter is quite unusual because it increases the already high capacitance of the filter which alone has usually to be compensated (matched) by an inductance. But because of the high coupling of the PSAW the increased total capacitance of the filter the rejection outside pass band is improved without a visible negative impact on the pass band. As a result of a proper chosen capacitance value up to 5 dB better rejection is achieved in the near stop band. A proper capacitance of the capacitor can be within 1-20 pF.

A more detailed description of the invention can be taken from the embodiments which are illustrated by the accompanied drawings. The drawings are drawn schematically only and are thus not to scale. Specific details may be depicted enlarged for better understanding.

Figure 1:
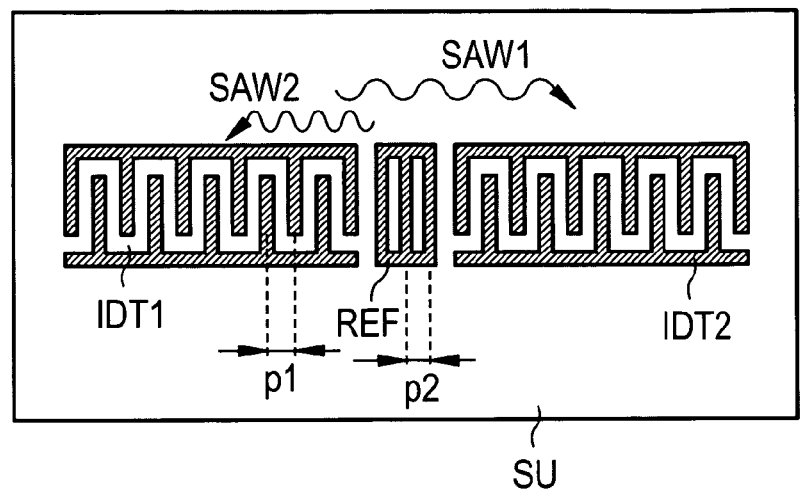
FIG. 1 shows a part of an electrode pattern of a first embodiment.

FIG. 1 schematically shows a part of an electrode pattern of a filter according to a first embodiment. Two transducers IDT1 and IDT2 are arranged on both sides of a reflector REF within an acoustic track on the surface of a piezoelectric substrate SU. The transducers can have a normal (regular) finger structure where all fingers have the same width and the same spacing from adjacent fingers thereby defining a first finger period p1 that can be assigned to wavelength 1 and hence to a centre frequency of the transducer. Both transducers can have the same finger period p1. The reflector REF provides a finger grating of a second finger period p2 different from p1. Preferably the second finger period is assigned to a frequency within the stop band of the filter. Preferably the transducer do not have a normal finger structure but are SPUDT transducers that emit acoustic waves in a preferred direction.

During operation of the filter a surface acoustic wave SAW1 is generated by first transducer IDT1 that is assigned in this example to be an input transducer. The wave SAW1 propagates towards the second transducer. When entering the grating of the reflector REF those frequencies that comply with the second finger period p2 of the reflector are reflected while other frequencies differing there from can pass the reflector without being reflected. The reflected wave is denoted by SAW 2 travels back towards input transducer and, at last, can leave the acoustic track beyond the first transducer. The non-reflected wave components of SAW1 can reach the second (output) transducer IDT2 and re-converted into electric signals. The resulting transfer function of the filter is attenuated at the frequency that is assigned to the second period p2. By properly choosing the first and second period p1/p2 a specific attenuation of the filters response at any position within the stop band can be achieved. This position can be selected at the high frequency side of the pass band as well as at the respective low frequency side.

Figure 2:
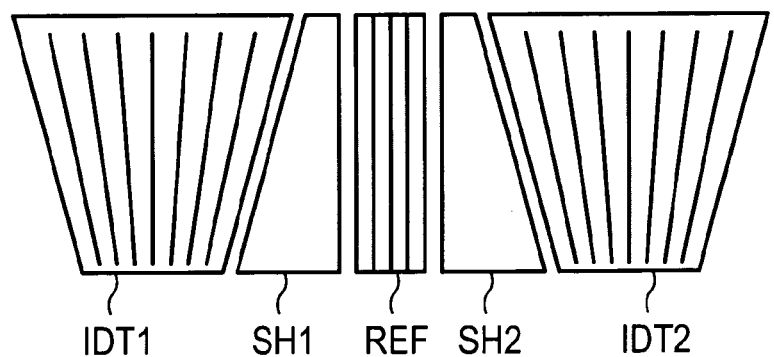
FIG. 2 shows schematically a filter arrangement of a first transducer, a reflector and two shielding structures within an acoustic track.

FIG. 2 shows a filter arrangement with a first and a second fan shaped transducers IDT1 and IDT2 arranged in an acoustic track on a piezoelectric substrate where PSAWs can propagate. Between the two transducers a first shielding structure SH1 and a second shielding structure SH2 are arranged. Between the two shielding structures a reflector REF is positioned. The first transducer IDT1 may be an input transducer of the filter while the second transducer IDT2 may be the output transducer. The transducers may have the same finger pattern but in a finger sequence that is mirrored relative to each other. Both transducers have increasing dimensions in the y-direction and are thus of an trapezoid shape. The shielding structures SH have a trapezoid shape too but its dimensions are decreasing in the y-direction. In this embodiment the shielding structures cover most of the substrate's surface between the adjacent elements. They serve to tune the acoustic wave velocity by providing a desired metallization ratio and to shield the input transducer from the output transducer. The transducers IDT are fan shaped and have SPUDT fingers.

The reflector has a reflective grating with shorted reflector finger whose finger period is constant in the transversal direction that is normal to the propagation direction of the acoustic wave and chosen to provide a maximum of reflectance in a stop band of the filter.

When using a high coupling substrate like substrates that allow PSAW generation like lithium niobate with a cut LN(41±30°)rotY or lithium tantalate with a cut LT(36±5°) rotXY the number of reflecting fingers can be kept low while yielding a high reflection rate. In an example, around 80% reflection can be reached with about 16 reflector fingers at a frequency according the second finger period p2. At this frequency the reflector REF has two fingers per wavelength λ. Waves of other frequencies preferably within the pass band of the filter see another number of reflector fingers. The number is reduced when p1<p2 but increased when p2<p1. As a further effect, the reflectance of a reflector is best for exactly two finger per wavelength. For frequencies close to 3 fingers per wavelength nearly no reflection takes place. Hence, by properly choosing periods p1 and p2 a high frequency selectivity of the reflector yields.

Figure 3A:
FIG. 3A shows shielding structure with a finger grating.

FIG. 3A schematically shows an exemplary shielding structure having a non-reflective finger grating.

Figure 3B:
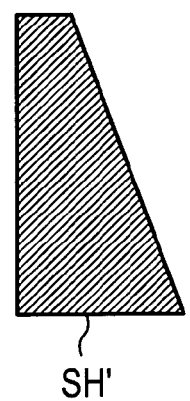
FIG. 3B shows a fully metalized shielding structure.

FIG. 3B schematically shows a fully metalized shielding structure.

A desired and optimized shielding structure is chosen to provide a desired metallization ratio to compensate the different delay times in the different channels of the filter produced by the fan structure. As shown in FIG. 3A, the finger grating of the shielding structure SH may be increasing as well. For achieving a good compensation of differences in the delay times the shielding structure may comprise a fully metalized area as shown in FIG. 3B such that the delay time is dependent only on the length of the metalized area in a respective channel. Thereby the shape of the metalized area of the shielding structure SH may deviate in the inclining angle.

The shielding structure is further designed to minimize propagation loss on a surface free of metal where otherwise high losses have to be expected. In an embodiment the gap between shielding structure and transducer is about the same as the gap between adjacent electrode fingers in the transducer.

Figure 4:
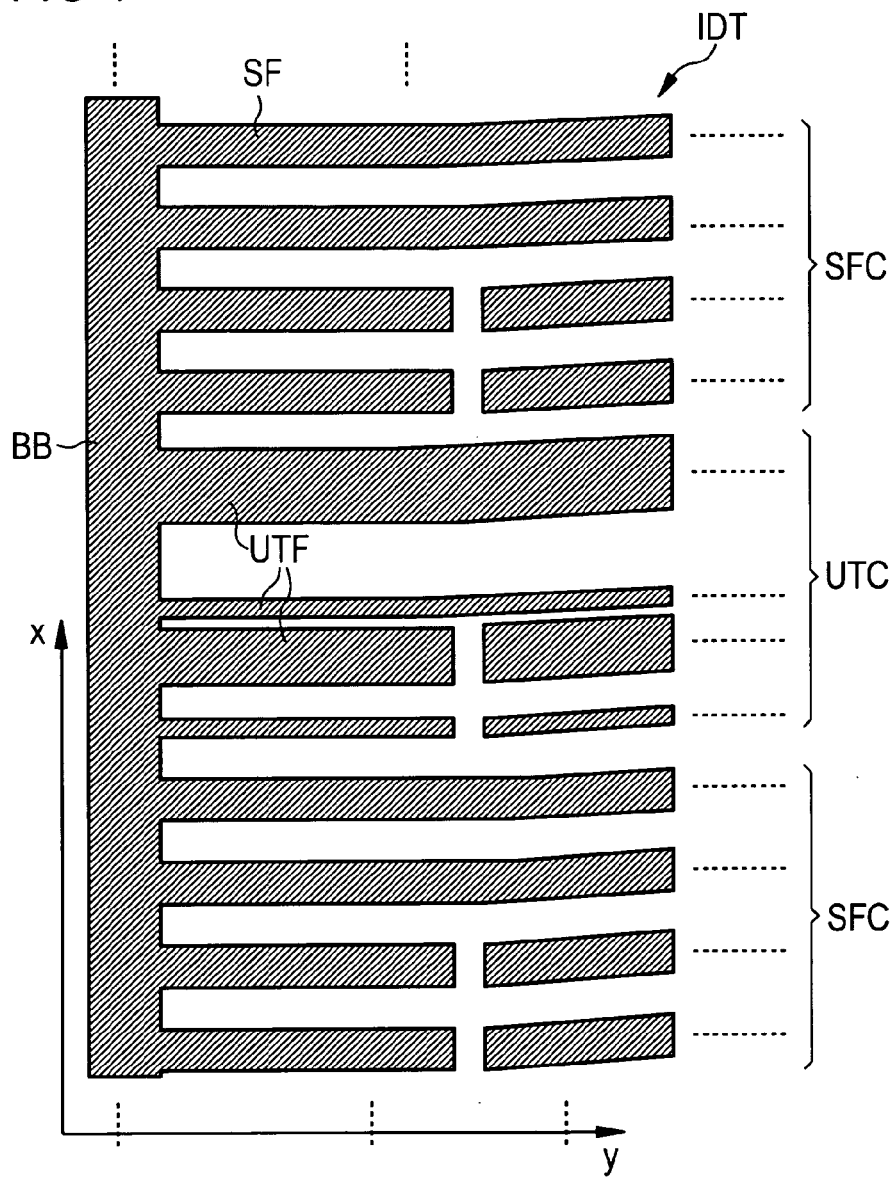
FIG. 4 shows a part of an electrode pattern of an embodiment.

FIG. 4 shows a section of an electrode finger pattern of a fan shaped transducer that can be used as a first and a second transducer in a filter of a first embodiment. Depicted is a section of the transducer area near a busbar BB. The transducer comprises a lot of cells, the number of which is chosen according to the desired transfer function between 25 and 150. The cells have a length in the longitudinal direction along the x axis of e.g. one wavelength $\lambda$ and is preferably the same in all cells. The cells are chosen from the group split finger cells with four fingers, SPUDT cells with at least four fingers of the type Hanma Hunsinger, SPUDT cells with at least four fingers of the type FEUDT and cells that do not reflect nor excite an acoustic wave. In the embodiment, a Hanma Hunsinger SPUDT cell UTC with four SPUDT fingers UTF is arranged between two split finger cells SFC with four split fingers SF per cell. Number and sequence of different cells are optimized for best performance in view of passband behavior and rejection.

The transducer is fan shaped such that the width of the fingers and/or the distances there between are increasing in the transversal direction that is along the y-axis. The dotted lines indicate that the transducer extends beyond the depicted section. By increasing the dimensions in transversal direction the wavelength of the excited SAW (PSAW) increases at the same time. By dividing the transducer IDT in the transversal direction into channels of a given bandwidth and a middle frequency the total transducer IDT has a bandwidth reaching from the middle frequency of the first channel with the lowest wavelength to the middle frequency of the opposite channel having the largest wavelength.

For a specific filter embodiment a filter is manufactured having a cell type structure similar to the finger pattern shown in FIG. 1 but comprising SPUDT cells of the FEUDT type too. A lithium tantalate substrate is chosen having a cut angle LT36rotYX. The metallization mainly comprised of A is applied with a relative thickness h/$\lambda$ of 1%. The filter can be mounted within a package having small dimensions like 7 mm×5 mm.

Despite a medium coupling (5%) of the PSAW into the LT36rotYX substrate material the filter shows a low loss behavior and a passband having a width of 10% and a temperature coefficient of frequency that is 3 times smaller than the respective TCF of a filter made on a LNYZ material having a higher coupling for Rayleigh waves.

This allows specifying a more soft transition between passband and stopband.

Figure 5:
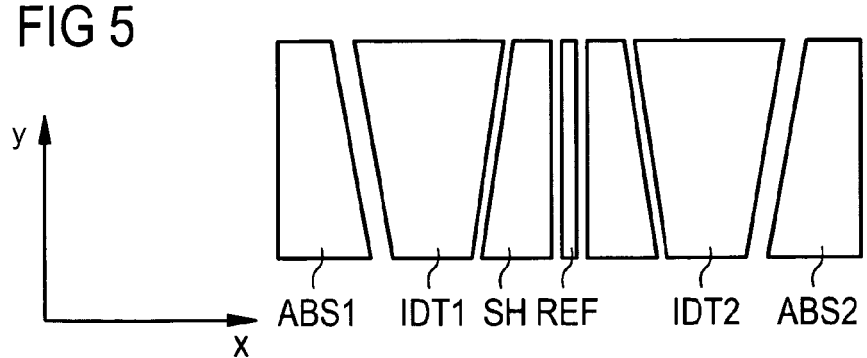
FIG. 5 shows the filter arrangement of FIG. 2 further comprising two absorbers.

FIG. 5 schematically shows a filter according to FIG. 2 further comprising an absorber ABS1/ABS2 each at both ends of the acoustic track. The absorbers absorb and damp waves that are leaving the acoustic track beyond the outermost transducer fingers. If not absorbed these waves could be reflected at a structure like a substrate edge or a metallization and possibly re-enter the acoustic track where they may cause a unwanted signal that could interfere with the wanted signal.

With an arrangement according to FIG. 2 comprising fan shaped transducers according to FIG. 4 build up on a higher coupling substrate like mentioned LNR41 a relative bandwidth of 55% of the filter can yield in dependence on the maximum difference of finger period in the outermost channels of the fan shaped transducers.

Despite applicable to filters build up on high coupling LN substrates and LT substrates as well the embodiments described above as well as the following embodiments refer to filters build up on mentioned LN substrates as far as not explicitly stated to the contrary.

Figure 5A:
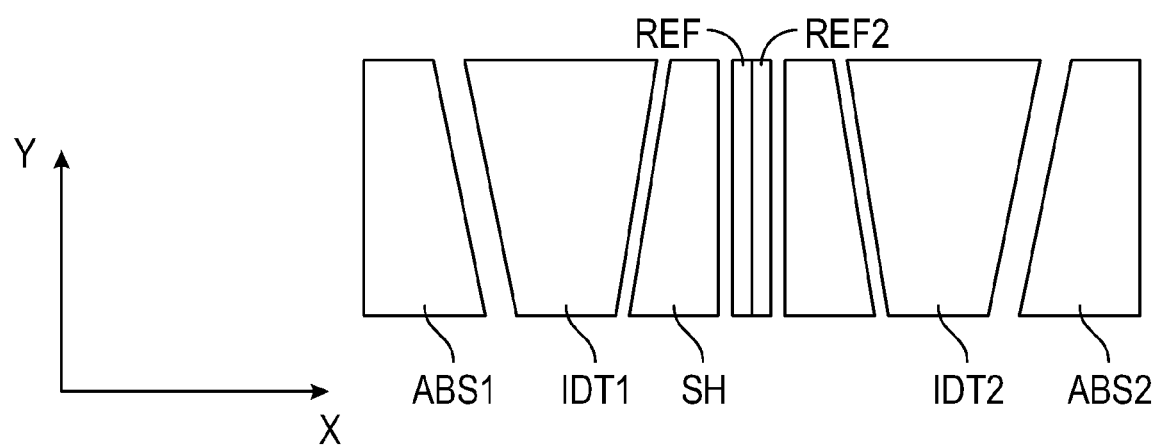
FIG. 5A shows the filter arrangement of FIG. 5 further comprising a further reflector.

FIG. 5A schematically shows the filter arrangement according to FIG. 5 further comprising a reflector REF2. As shown in FIG. 5A, reflector REF2 is positioned adjacent to reflector REF. For example, reflector REF2 has a third mean finger period assigned to a second stop band frequency different from the first stop band frequency and different from the centre frequency.

Figure 6:
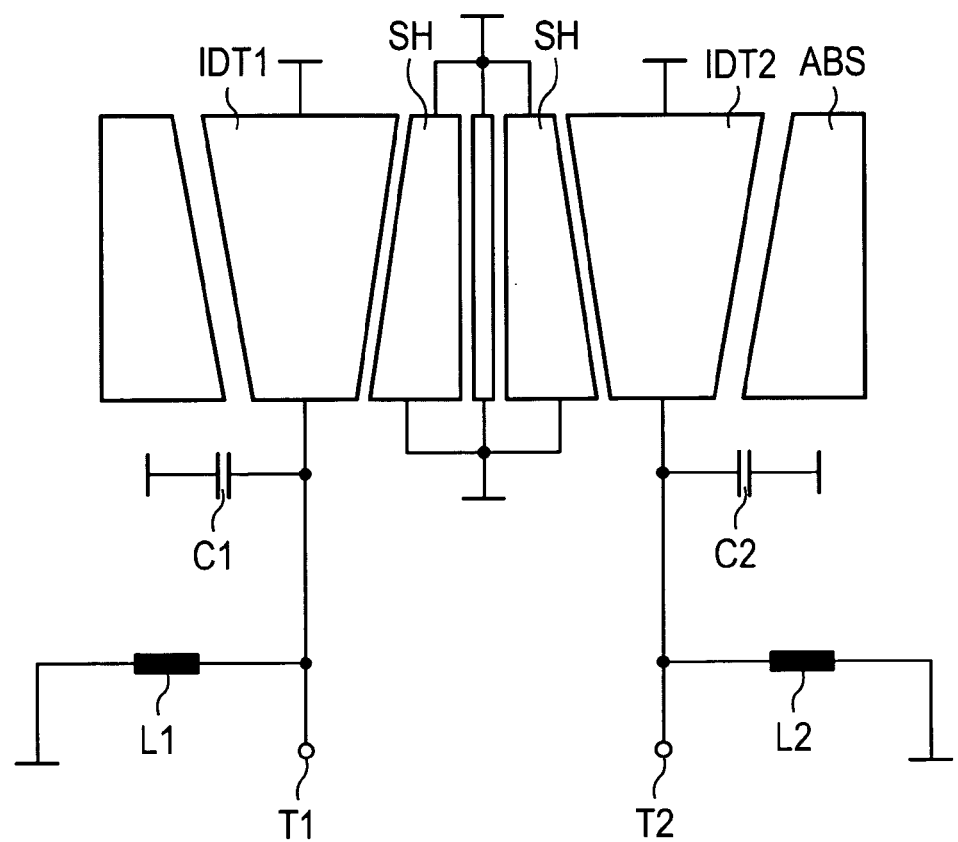
FIG. 6 shows the filter arrangement of FIG. 5 including the electrical terminals further comprising passive matching components.

A further improvement of the filter provides a matching circuit as depicted in FIG. 6. Input terminal T1 and output terminal T2 of a filter according to FIG. 2 are connected to ground via a first and a second shunt line. In the first shunt line an inductance L1, L2 is arranged respectively to compensate for the capacitive SAW transducer. In the second shuntline a capacitor C1, C2 is arranged respectively. As this is quite unusual the result of an overall improvement of the filter is surprising. The reason is that the high coupling substrate for PSAWs and the large bandwidth result in a high rejection outside the passband where the filter of FIG. 6 is e.g. twice as capacitive as a filter with only parallel inductance according to usual matching of SAW filters. If for the substrate a cut angle is chosen that is far away from maximum coupling an added capacitance as proposed by this embodiment does not visibly deform the pass band and increases the rejection performance up to 5 dB in the region near the pass band.

For matching the filter to 50 ohms the inductances L1 and L2 can be set in the nH region from 10 nH to 70 nH for example. At the same time the capacitors C1 and C2 are set to values of 1-50 pF, for example to 15 pF.

Figure 7A:
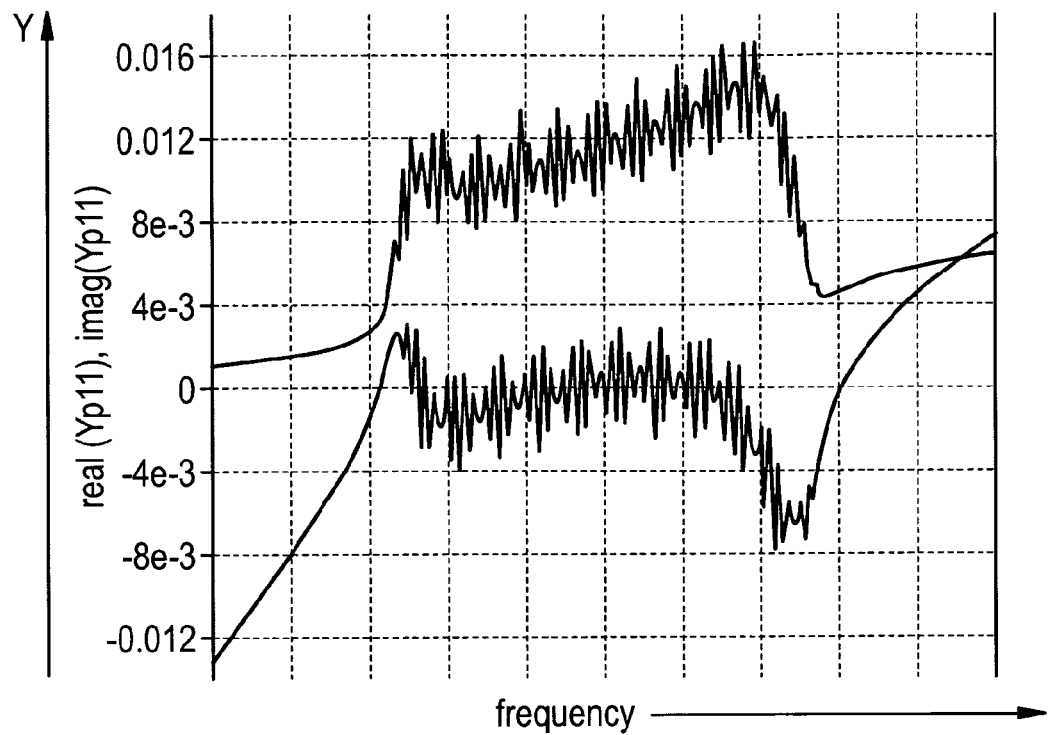
FIG. 7A shows the admittance of a filter that is circuited in parallel with two inductances.

FIG. 7A shows real (upper curve) and imaginary part of filter admittance for the example without added capacitor.

Figure 7B:
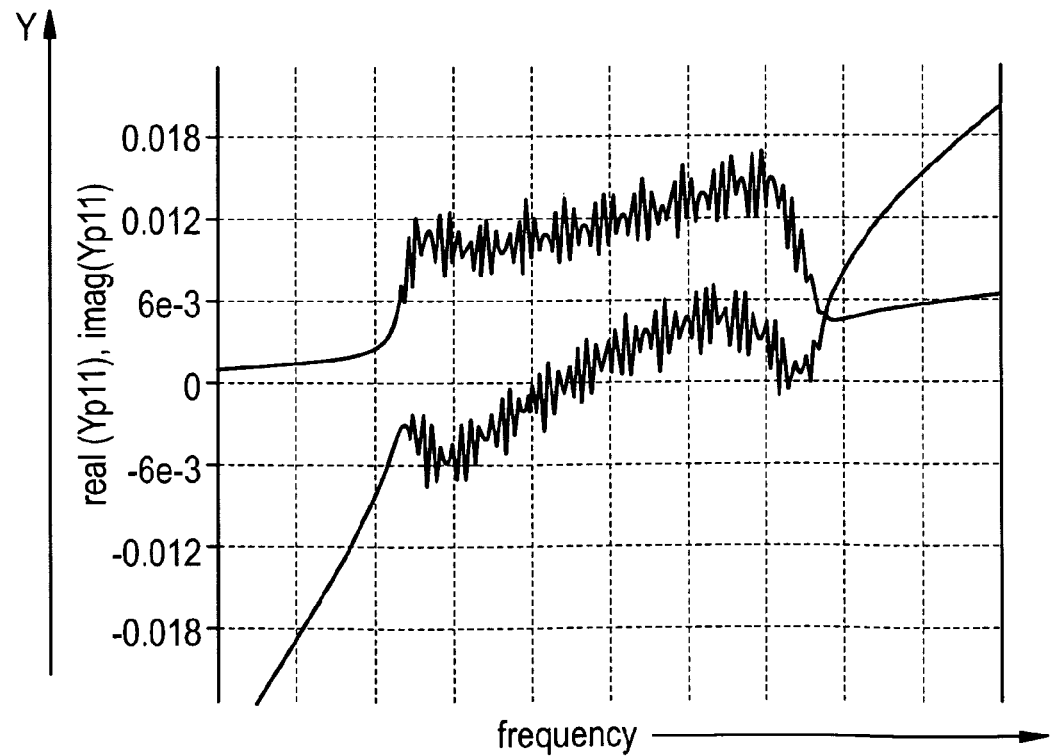
FIG. 7B shows the admittance of the same filter that is further circuited in parallel with two capacitors.

FIG. 7B shows real (upper curve) and imaginary part of filter admittance for the same example with added capacitor (C1=1 pF, C2=15 pF). What can be seen is the that imaginary part of admittance becomes highly capacitive at the upper edge of passband where it is higher than real part.

Figure 8:
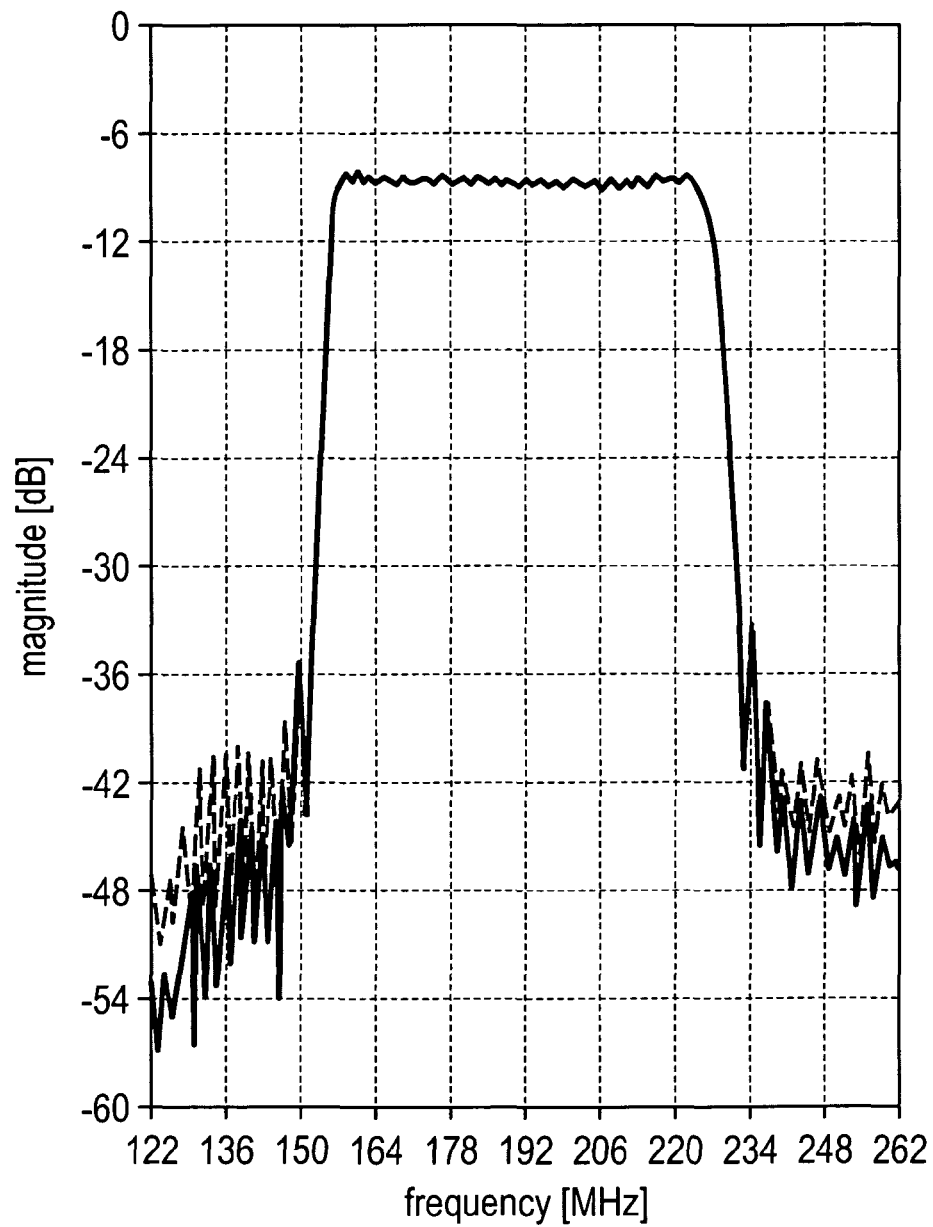
FIG. 8 shows the transfer function of a filter around the passband of the filter.

FIG. 8 shows the complete transfer functions of the embodiments of FIGS. 7A and 7B. Dashed line is assigned to a filter without added capacitance while continuous line represents example of FIG. 7B. It becomes clear that the rejection in the near stopband region is improved.

Figure 9:
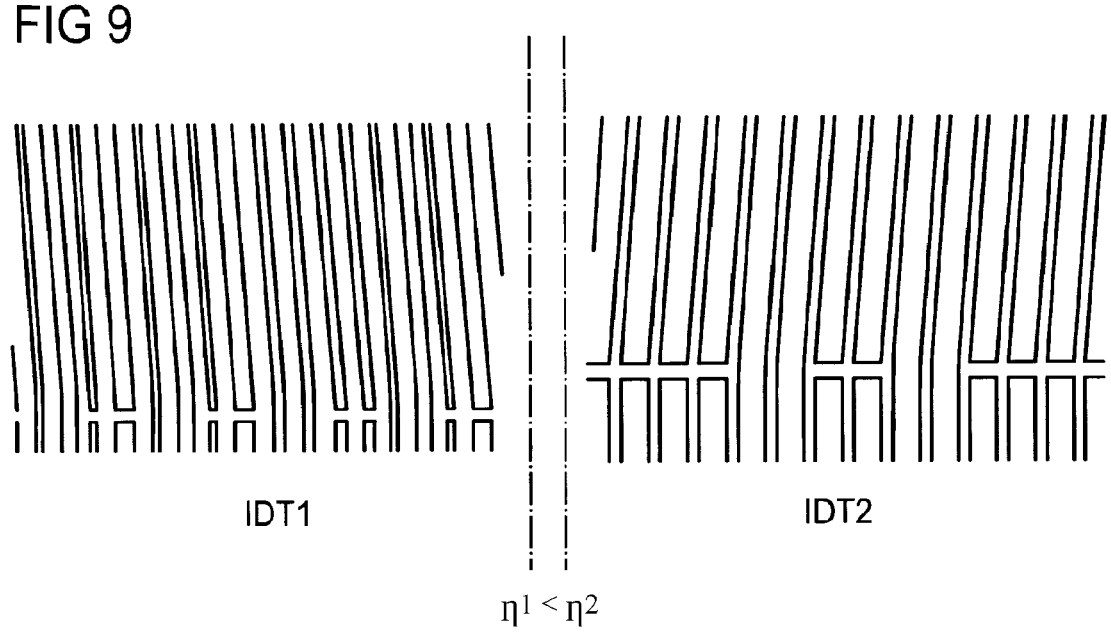
FIG. 9 shows selected parts of first and second transducers having different metallization ratio.

FIG. 9 shows parts of the transducer metallization to explain high and low metallization ratios and $\eta 1$ $\eta 2$. Despite having the same finger period the finger widths are reduced in the transducer IDT1 with respect to the other transducer IDT2 that has the lower metallization ratio $\eta 1$.

Figure 10:
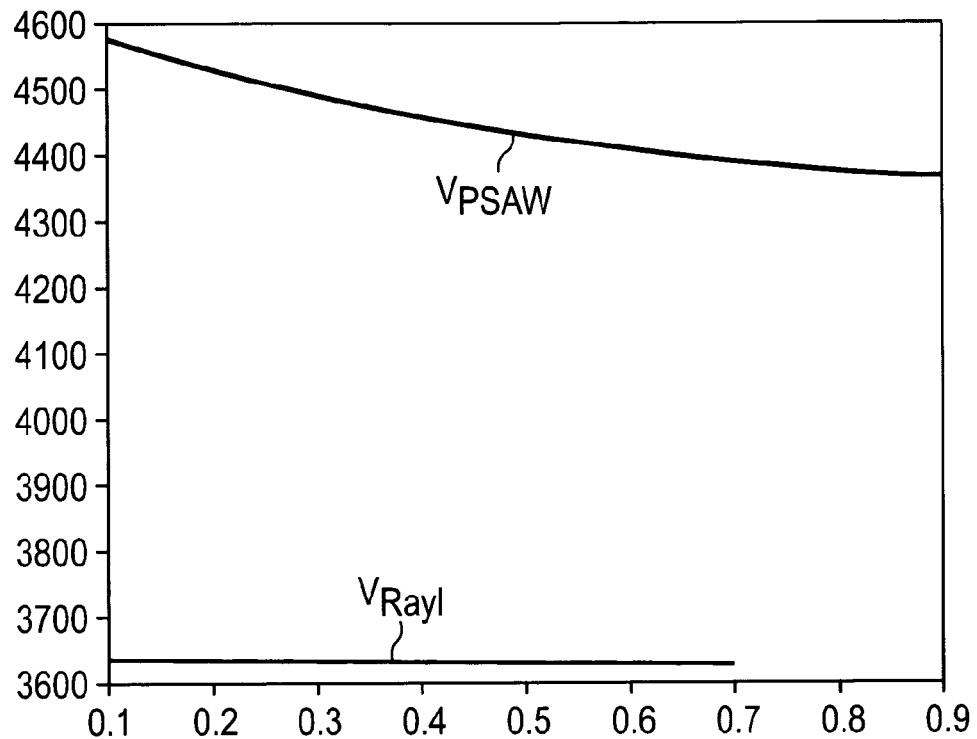
FIG. 10 shows the dependency of the velocity of an acoustic wave from metallization ratio.

FIG. 10 shows the velocity of a Rayleigh wave and of a PSAW dependent on the chosen metallization ratio. One can see that the velocities differ strongly and velocity VPSAW of PSAW is about 20% higher than velocity VRayl of Rayleigh wave. Further, VPSAW is dependent on metallization ratio while VRayl is not. Changing the metallization ratio from about 0.3 in the first transducer IDT1 to 0.7 in the second transducer IDT2 produce distinct effect on PSAW but not on Rayleigh wave. This effect is compensated by changing the finger period in order to have same PSAW frequency response in both transducers. Hence undesired shares of Rayleigh waves can be deleted as the transducer response for PSAWs can be shifted towards each other by about 2%. According to the difference between VPSAW and VRayl a input signal at centre frequency of the filter produces to a minor amount a Rayleigh wave that strongly differs from centre frequency that is dominated by the desired PSAW and hence produces signals in the lower stop band.

Figure 11:
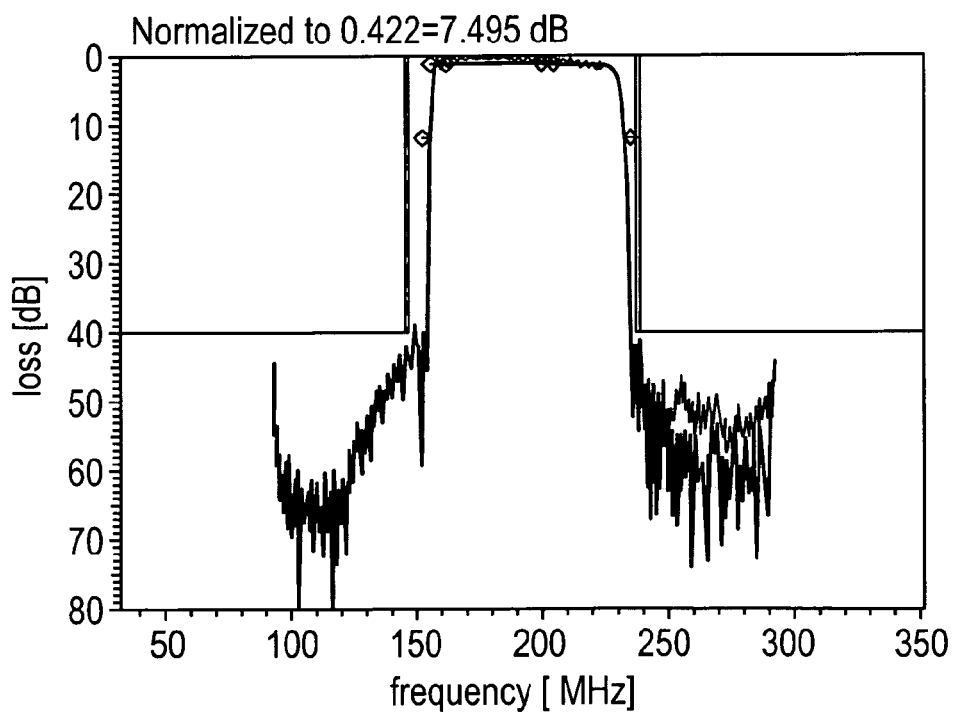
FIG. 11 shows the transfer function of a filter according to another embodiment.

FIG. 11 shows a transfer function of a filter according to FIG. 2 (lower curve) compared to a transfer function of an according filter without reflector REF (upper curve). In this example the second period p2 of the reflector REF accords to a frequency within the near upper stopband. Accordingly, FIG. 11 shows the improved stopband rejection in the near upper stopband.

On a properly selected PSAW substrate and with a chosen metallization a coupling of the PSAW is achieved of 11%. Hence, a very broad bandwidth of 55% is achieved with this filter that is a record breaking value for SAW filters. The insertion loss is about −13 dB. Nevertheless the skirts of the passband are steep enough and in the lower stopband an attenuation of more than 40 dB is achieved. In the higher stopband the attenuation reaches 35 dB.

Moreover the temperature coefficient for LN41rotY is only—64 ppm/° C. that is smaller than its Rayleigh counterpart (−87 ppm/° C.) build on a LNYZ substrate material allowing more margin for transition.

The new filter is further improved in insertion loss and, according to the reflector, shows an improved stop band.

A comparison is made between S21 measurement of a filter built on LN41RY and a filter build on LNYZ with nearly the same relative bandwidth. The filter built on LN41RY shows a lower insertion loss and has steeper skirts.

The following table shows the measured data for these filters.

|  | Filter on LNYZ Rayleigh wave (typical value) | Filter on LN41RY PSAW (typical value) |
| --- | --- | --- |
| Relative bandwidth | 50% | 55% |
| Insertion loss | 19.5 dB | 13 dB |
| Input return loss | 4.5 dB | 9.5 dB |
| Output return loss | 4.5 dB | 9.5 dB |
| TCF | −87 ppm/k | −64 ppm/K |

Most reasonable is the low TCF (temperature coefficient of frequency) of the new material LN41RY being lower than the TCF of LNYZ using Rayleigh waves. This allows specifying a more soft transition between pass band and stop band which is easier to achieve.

The invention shall not be limited by the specific embodiments and the according figures but shall only be defined by the claims and the respective description as given above.

LIST OF REFERENCE SYMBOLS USED IN THE DRAWINGS

IDT1, IDT2 first and second (SAW) transducer
REF reflector
SAW1 generated surface acoustic wave
SAW2 reflected surface acoustic wave
p1, p2 first and second finger period
SU substrate
SH, SH1, SH2, SH' shielding structures
BB busbar
SF split finger
SFC split finger cell
UTC Hanma Hunsinger SPUDT cell
UTF Hanma Hunsinger SPUDT cell finger
ABS1, ABS2 absorber
C1, C2 capacitors
L1, L2 inductances
T1, T2 input and output terminals
η1 η2 metalization ratio

The invention claimed is:

1. A filter working with surface acoustic waves comprising:
a piezoelectric substrate (SU) providing an acoustic track on the surface of the substrate;
a first transducer (IDT1) arranged in the acoustic track coupled to an input, having a first mean finger period (p1) assigned to a centre frequency of a pass band of the filter;
a second transducer (IDT2) arranged in the acoustic track coupled to an output, having the same first mean finger period (p1);
a reflector arranged between the first and second transducers having a second mean finger period (p2) assigned to a stop band frequency different from the centre frequency,
wherein the first and second transducers (IDT1,IDT2) are fan type transducers,
wherein a width of each transducer finger and a spacing between the fingers of a respective pair of adjacent transducer fingers are increasing in a transversal direction, the transversal direction being normal to a longitudinal direction of the acoustic track but within the substrate plane, the transducers being adapted to provide a relative bandwidth of the transducer of at least 8%, and
wherein both the transducers (IDT1,IDT2) comprise Single Phase Uni-Directional Transducer (SPUDT) cells such that an acoustic wave is propagated towards a preferred direction; and
a shielding structure (SH) between the first and second transducers (IDT1,IDT2) minimizing the free surface between the first transducer (IDT1), the reflector (REF) and the second transducer (IDT2), the shielding structure (SH) being a fully metalized area or comprising a non-reflective finger grating.

2. The filter of claim 1, wherein the piezoelectric substrate is cut from a piezoelectric crystal with a cut angle chosen to propagate a pseudo surface acoustic wave (PSAW) on the surface of the substrate.

3. The filter of claim 2, wherein the PSAW propagating substrate (SU) is chosen from a lithium niobate with a cut LN(41±30°)rotY and from a lithium tantalate with a cut LT(36±5°)rotXY.

4. The filter of claim 1, where the first and second transducers (IDT1,IDT2) have a metallization height relative to wavelength h/λ of 0.5-4%.

5. The filter of claim 4, where the first and second transducers (IDT1,IDT2) have a metallization height relative to wavelength h/λ of 1%.

6. The filter of claim 1, wherein the SPUDT cells are chosen from the type Hanma Hunsinger and Floating Electrode Uni-Directional Transducer (FEUDT).

7. The filter of claim 1, wherein the SPUDT cells comprise 2 fingers per wavelength λ.

8. The filter of claim 1, wherein the shielding structure (SH) has a trapezoid area, the width of which is increasing in a transversal direction opposite to the width increase of the transducers (IDT1,IDT2).

9. The filter of claim 1, wherein a damping structure or an absorber (ABS) is arranged on the surface of the substrate (SU) at each of the longitudinal ends of the acoustic track.

10. The filter of claim 1, wherein each transducer (IDT1, IDT2) comprises a number of n parallel channels extending along the longitudinal direction, the PSAW having a delay time being the same in each channel, and n is an integer 5<n<50.

11. The filter of claim 10, wherein each channel has a given transversal extent in the transversal direction, and
wherein the finger widths and finger spacings of the respective channel are constant along the transversal extent but are increasing when turning to an adjoining channel.

12. The filter of claim 1, wherein each of the first and second transducers (IDT1,IDT2) is connected to ground via a respective shunt arm, and
wherein a respective one of two capacitors (C1,C2) each is arranged in each respective shunt arm.

13. The filter of claim 12, wherein the capacitance of the two capacitors (C1,C2) is independently chosen to be between 1 and 20 pF.

14. The filter of claim 1, wherein the reflector (REF) comprises reflector fingers with a constant spacing, and
wherein the reflector has two reflector fingers per wavelength $\lambda$ at the stop band frequency.

15. The filter of claim 1, comprising a further reflector (REF) having third mean finger period assigned to a second stop band frequency different from the stop band frequency and different from the centre frequency.

16. The filter of claim 15, wherein further shielding structures (SH) are arranged between one of the reflectors (REF) and a transducer (IDT), or between two reflectors (REF).

17. A filter working with surface acoustic waves comprising:
a piezoelectric substrate (SU) providing an acoustic track on the surface of the substrate;
a first transducer (IDT1) arranged in the acoustic track coupled to an input;
a second transducer (IDT2) arranged in the acoustic track coupled to an output;
a reflector arranged between the first and second transducers having a mean finger period (p2) assigned to a stop band frequency different from a centre frequency,
wherein the first and second transducers (IDT1,IDT2) are fan type transducers,
wherein a width of each transducer finger and a spacing between the fingers of a respective pair of adjacent transducer fingers are increasing in a transversal direction, the transversal direction being normal to a longitudinal direction of the acoustic track but within the substrate plane, the transducers being adapted to provide a relative bandwidth of the transducer of at least 8%, and
wherein both the transducers (IDT1,IDT2) comprise Single Phase Uni-Directional Transducer (SPUDT) cells such that an acoustic wave is propagated towards a preferred direction; and
a shielding structure (SH) between the first and second transducers (IDT1,IDT2) minimizing the free surface between the first transducer (IDT1), the reflector (REF) and the second transducer (IDT2), the shielding structure (SH) being a fully metalized area or comprising a non-reflective finger grating,
wherein the first and the second transducers (IDT1,IDT2) have different metallization ratios ($\eta 1,\eta 2$) and different mean finger periods (p1) and (p3) such that the centre frequency that is shifted by the different metallization ratio for PSAW is the same in both transducers.

18. The filter of claim 17, wherein a first metallization $\eta 1$ ratio is chosen between 0.15 and 0.40, and wherein a second metallization $\eta 2$ ratio is chosen between 0.60 and 0.80.

* * * * *